United States Patent
Shiga et al.

(10) Patent No.: US 8,404,522 B2
(45) Date of Patent: Mar. 26, 2013

(54) DICING TAPE-INTEGRATED FILM FOR SEMICONDUCTOR BACK SURFACE, AND PROCESS FOR PRODUCING SEMICONDUCTOR DEVICE

(75) Inventors: Goji Shiga, Osaka (JP); Naohide Takamoto, Osaka (JP); Fumiteru Asai, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/172,945

(22) Filed: Jun. 30, 2011

(65) Prior Publication Data

US 2012/0028415 A1 Feb. 2, 2012

(30) Foreign Application Priority Data

Jul. 29, 2010 (JP) ................................. 2010-170933

(51) Int. Cl.
*H01L 21/00* (2006.01)

(52) U.S. Cl. ................ 438/113; 438/464; 257/E21.599; 257/E23.001; 428/214; 428/336

(58) Field of Classification Search .......................... None
See application file for complete search history.

(56) References Cited

U.S. PATENT DOCUMENTS

| 2009/0053518 A1 | 2/2009 | Saiki et al. | |
|---|---|---|---|
| 2010/0219507 A1* | 9/2010 | Misumi et al. | 257/618 |
| 2010/0227165 A1* | 9/2010 | Maruyama et al. | 428/355 EN |
| 2010/0301497 A1 | 12/2010 | Misumi et al. | |

FOREIGN PATENT DOCUMENTS

| JP | 2007-261035 A | 10/2007 |
|---|---|---|
| JP | 2008-6386 A | 1/2008 |
| JP | 2008-166451 A | 7/2008 |

OTHER PUBLICATIONS

Non-Final Office Action, dated Oct. 9, 2012, issued by the United States Patent and Trademark Office, in U.S. Appl. No. 13/558,540.

* cited by examiner

*Primary Examiner* — Charles Garber
*Assistant Examiner* — Abdulfattah Mustapha
(74) *Attorney, Agent, or Firm* — Sughrue Mion, PLLC

(57) ABSTRACT

The present invention relates to a dicing tape-integrated film for semiconductor back surface including: a dicing tape including a base material and a pressure-sensitive adhesive layer laminated in this order, and a film for semiconductor back surface provided on the pressure-sensitive adhesive layer of the dicing tape, where the pressure-sensitive adhesive layer has a thickness of from 20 μm to 40 μm.

5 Claims, 1 Drawing Sheet

DICING TAPE-INTEGRATED FILM FOR SEMICONDUCTOR BACK SURFACE, AND PROCESS FOR PRODUCING SEMICONDUCTOR DEVICE

FIELD OF THE INVENTION

The present invention relates to a dicing tape-integrated film for semiconductor back surface and to a process for producing a semiconductor device. The film for semiconductor back surface is used for protecting the back surface of a semiconductor element such as a semiconductor chip and for enhancing the strength thereof.

BACKGROUND OF THE INVENTION

Recently, thinning and miniaturization of a semiconductor device and its package have been increasingly demanded. Therefore, as the semiconductor device and its package, flip chip type semiconductor devices in which a semiconductor element such as a semiconductor chip is mounted (flip chip-connected) on a substrate by means of flip chip bonding have been widely utilized. In such flip chip connection, a semiconductor chip is fixed to a substrate in a form where a circuit face of the semiconductor chip is opposed to an electrode-formed face of the substrate. In such a semiconductor device or the like, there may be a case where the back surface of the semiconductor chip is protected with a protective film to prevent the semiconductor chip from damaging or the like (see, Patent Document 1 to 3).

Patent Document 1: JP-A-2008-166451
Patent Document 2: JP-A-2008-006386
Patent Document 3: JP-A-2007-261035

However, in order to protect a back surface of a semiconductor chip by the protective film, it is necessary to add a new step for attaching the protective film to the back surface of the semiconductor chip obtained in a dicing step. As a result, the number of steps increases and production cost and the like increase. Accordingly, for the purpose of reducing the production cost, the present inventors have developed a dicing tape-integrated film for semiconductor back surface and filed an application therefor (not yet published at the time of filing the present application). The dicing tape-integrated film for semiconductor back surface has a structure including a dicing tape having a base material and a pressure-sensitive adhesive layer on the base material, and a film for flip chip type semiconductor back surface formed on the pressure-sensitive adhesive layer of the dicing tape.

At the production of the semiconductor device, the dicing tape-integrated film for semiconductor back surface is used as follows. First, a semiconductor wafer is attached onto the film for flip chip type semiconductor back surface in the dicing tape-integrated film for semiconductor back surface. Next, the semiconductor wafer is diced to form a semiconductor element. Subsequently, the semiconductor element is peeled from the pressure-sensitive adhesive layer of the dicing tape and picked up together with the film for flip chip type semiconductor back surface and then the semiconductor element is flip chip-connected onto an adherend such as a substrate. Consequently, a flip chip type semiconductor device is obtained.

For the semiconductor wafer dicing, widely employed is a so-called full-cut process of dicing to a depth reaching the base material layer of the dicing tape over the film for semiconductor back surface as the cutting depth of the dicing blade. Heretofore, taking the matter into consideration that the thickness of the pressure-sensitive adhesive layer is 10 µm or so and taking the dicing machine accuracy into consideration, much employed is a method of evading the failure in the dicing step by dicing to the base material over the pressure-sensitive adhesive layer in full-cut operation for taking production margin. Accordingly, the subsequent picking-up process enables integrally peeling the semiconductor chip along with the film for semiconductor back surface, without requiring any additional step or operation of cutting the film for semiconductor back surface.

However, cutting to the base material produces base material-derived cutting dust, and the cutting dust adheres to the side of the diced semiconductor chips and may form a deposit of so-called burr around the chips. When the semiconductor chip with such burr is built in a semiconductor device, it may cause interconnection failure to adherends and contamination of substrate circuits, which may result in lowering the reliability of semiconductor devices.

SUMMARY OF THE INVENTION

The present invention has been made in consideration of the foregoing problems, and an object thereof is to provide a dicing tape-integrated film for semiconductor back surface which is capable of exhibiting good dicing aptitude and capable of preventing the generation of burr around the semiconductor chips to be produced by dicing of a semiconductor wafer, thereby making it possible to produce semiconductor devices of high reliability with improving the production yield, and to provide a process for producing semiconductor devices.

The present inventors have assiduously studied for the purpose of solving the existing problems and, as a result, have found that, by employing the following constitution, a dicing tape-integrated film for semiconductor back surface having good dicing aptitude and capable of preventing the generation of burr around semiconductor chips can be provided, and have completed the present invention.

Namely, the present invention relates to a dicing tape-integrated film for semiconductor back surface (herein after may be referred as "integrated film") which includes: a dicing tape including a base material and a pressure-sensitive adhesive layer laminated in this order, and a film for semiconductor back surface provided on the pressure-sensitive adhesive layer of the dicing tape, in which the pressure-sensitive adhesive layer has a thickness of from 20 µm to 40 µm.

The integrated film comprises a pressure-sensitive adhesive layer having a thickness of from 20 µm to 40 µm, and can therefore fully secure the production margin by cutting to the pressure-sensitive adhesive layer in dicing, though the production margin has heretofore been secured by cutting to the base material in dicing. Accordingly, the cutting dust to be generated by cutting to reach the base material can be prevented. As a result, the film can contribute toward producing semiconductor devices of high reliability by preventing the generation of burr around semiconductor chips while keeping the good dicing property thereof. When the thickness of the pressure-sensitive adhesive layer is less than 20 µm, then the production margin by the pressure-sensitive adhesive layer would be insufficient and cutting the film may reach the base material thereby to inevitably produce the cutting dust from the base material, therefore resulting in the generation of burr around semiconductor chips. On the other hand, when the thickness of the pressure-sensitive adhesive layer is more than 40 µm, then the flexibility and the tackiness of the pressure-sensitive adhesive layer may be too high and therefore the ability thereof to hold and fix semiconductor wafers may lower with the result that the semiconductor chips may be broken or cracked during dicing and the once cut semiconductor chips may block together.

When the thickness of the pressure-sensitive adhesive layer is taken as x and the thickness of the film for semiconductor back surface is taken as y, it is preferable that the ratio x/y is from 1 to 4. When the ratio x/y is from 1 to 4, then the adhesive force of the pressure-sensitive adhesive layer may be readily regulated within a suitable range and the pressure-sensitive adhesive layer can secure good peeling strength to such a degree that, between the pressure-sensitive adhesive layer and the film for semiconductor back surface, the holding force in dicing and the peeling easiness in picking up can be well balanced.

When the thickness of the dicing tape is taken as z and the thickness of the film for semiconductor back surface is taken as y, it is preferable that the ratio z/y is from 1.5 to 25. When the ratio z/y is from 1.5 to 25, then the film for semiconductor back surface may be prevented from being so thin as to worsen its picking-up property, and on the other hand, the film for semiconductor back surface may be prevented from being so thick as to produce burr that is derived from the film for semiconductor back surface, around semiconductor chips in dicing.

The present invention also provides a process for producing a semiconductor device using the above-mentioned dicing tape-integrated film for semiconductor back surface, the process including: attaching a semiconductor wafer onto the film for semiconductor back surface of the dicing tape-integrated film for semiconductor back surface, dicing the semiconductor wafer to form a semiconductor chip in which a cutting depth is so controlled as to fall within a range overstepping one side of the pressure-sensitive adhesive layer that faces the film for semiconductor back surface and not reaching the other side of the pressure-sensitive adhesive layer that faces the base material, peeling the semiconductor chip from the pressure-sensitive adhesive layer of the dicing tape together with the film for semiconductor back surface, and flip chip-connecting the semiconductor chip onto an adherend.

In the production process, the integrated film in which the thickness of the pressure-sensitive adhesive layer is from 20 μm to 40 μm is used, and the cutting depth with the dicing blade is defined to fall within a predetermined range in the dicing step. Therefore, the production margin, which is heretofore secured by cutting to reach the base material in dicing, can be well secured by cutting to reach the pressure-sensitive adhesive layer. Accordingly, the generation of the cutting dust to be caused by cutting to reach the base material can be prevented, and as a result, semiconductor devices of high reliability can be efficiently produced with preventing the generation of burr around semiconductor chips and with keeping the good dicing property in the process.

Preferably, in the dicing, the cutting depth is so controlled as to fall within a range of from 10% to 70% of the thickness of the pressure-sensitive adhesive layer from the side of the pressure-sensitive adhesive layer that faces the film for semiconductor back surface. When the cutting depth is controlled to fall within the above-mentioned range, then the cutting to reach the base material may be prevented even though the cutting depth accuracy fluctuation of various dicing machines is taken into consideration, and therefore the production process of the invention can readily accept various changes in production lines with preventing deep cutting to reach the base material. In addition, the production process of the invention can well secure the production margin in dicing and can therefore prevent generation of various failures such as dicing failure, etc.

DESCRIPTION OF REFERENCE NUMERALS AND SIGNS

1 Dicing Tape-Integrated Film for Semiconductor Back Surface
2 Film for Semiconductor Back Surface
3 Dicing Tape
31 Base Material
32 Pressure-Sensitive Adhesive Layer
33 Part Corresponding to Semiconductor Wafer-Attaching Part
4 Semiconductor Wafer
5 Semiconductor Chip
51 Bump Formed on the Circuit Face Side of Semiconductor Chip 5
6 Adherend
61 Conductive Material for Conjunction Attached to Connection Pad of Adherend 6

BEST MODE FOR CARRYING OUT THE INVENTION

Figure 1:
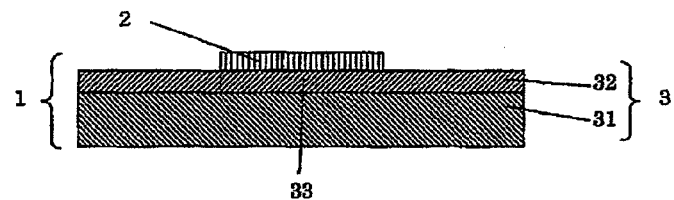
FIG. 1 is a cross-sectional schematic view showing one embodiment of a dicing tape-integrated film for semiconductor back surface of the invention.

Embodiments of the present invention are described with reference to FIG. 1 but the invention is not restricted to these embodiments. FIG. 1 is a cross-sectional schematic view showing one embodiment of a dicing tape-integrated film for semiconductor back surface according to the present embodiment. Incidentally, in the figures in the present specification, parts that are unnecessary for the description are not given, and there are parts shown by magnifying, minifying, etc. in order to make the description easy.
(Dicing Tape-Integrated Film for Semiconductor Back Surface)

As shown in FIG. 1, the dicing tape-integrated film for semiconductor back surface 1 (hereinafter sometimes also referred to as "integrated film", "dicing tape-integrated semiconductor back surface protective film", "film for semiconductor back surface with dicing tape", or "semiconductor back surface protective film with dicing tape") has a configuration including: the dicing tape 3 including the pressure-sensitive adhesive layer 32 formed on the base material 31, and, as formed on the pressure-sensitive adhesive layer 32, the film for semiconductor back surface 2 suitable for flip chip type semiconductors. Also as shown in FIG. 1, the dicing tape-integrated film for semiconductor back surface of the invention may be so designed that the film for semiconductor back surface 2 (hereinafter sometimes referred to as "semiconductor back surface protective film") is formed only on the part 33 corresponding to the semiconductor wafer-attaching part; however, the film for semiconductor back surface may be formed over the whole surface of the pressure-sensitive adhesive layer 32, or the film for semiconductor back surface may be formed on the part larger than the part 33 corresponding to the semiconductor wafer-attaching part but smaller than the whole surface of the pressure-sensitive adhesive layer 32. Incidentally, the surface of the film for semiconductor back surface 2 (surface to be attached to the back surface of wafer) may be protected with a separator or the like until the film is attached to wafer back surface.

In the integrated film 1, the thickness of the pressure-sensitive adhesive layer 32 is from 20 μm to 40 μm. Accordingly, the production margin in dicing can be well secured by cutting to reach the pressure-sensitive adhesive layer. In addition, the generation of cutting dust to be caused by cutting to reach the base material can be prevented and, as a result, the film can contribute toward production of semiconductor devices of high reliability while keeping the good dicing property thereof and while preventing the generation of burr around semiconductor chips. When the thickness of the pressure-sensitive adhesive layer is less than 20 μm, then the production margin with the pressure-sensitive adhesive layer will be insufficient and the film may be cut to reach the base material, and if so, cutting dust may be generated from the base material, and as a result, burr may be generated around semiconductor chips. On the other hand, when the thickness of the pressure-sensitive adhesive layer is more than 40 μm, then the flexibility and the tackiness of the pressure-sensitive adhesive layer may be too high and therefore the ability thereof to hold and fix semiconductor wafers may lower with the result that the semiconductor chips may be broken or cracked during dicing and the once cut semiconductor chips may block together.

The thickness of the pressure-sensitive adhesive layer 32 may be good to be from 20 μm to 40 μm. The uppermost limit of the thickness of the pressure-sensitive adhesive layer is preferably 38 μm, more preferably 35 μm. The lowermost limit of the thickness of the pressure-sensitive adhesive layer is preferably 23 μm, more preferably 25 μm. The pressure-sensitive adhesive layer 32 may be either a single layer or a multilayer.

Not specifically defined, when the thickness of the pressure-sensitive adhesive layer 32 is taken as x and the thickness of the film for semiconductor back surface 2 is taken as y, the ratio x/y is preferably from 1 to 4, more preferably from 1.1 to 3.9, even more preferably from 1.2 to 3.8. When the ratio x/y falls within the above range, then the pressure-sensitive adhesive layer may be given a suitable adhesive force and the peeling strength between the pressure-sensitive adhesive layer and the film for semiconductor back surface can be a suitable one, and the holding force in dicing and the peeling easiness in picking up can be well balanced.

Also not specifically defined, when the thickness of the dicing tape 3 is taken as z and the thickness of the film for semiconductor back surface 2 is taken as y, the ratio z/y is preferably from 1.5 to 25, more preferably from 1.6 to 24, even more preferably from 1.7 to 23. When the ratio z/y falls within the above range, then the film for semiconductor back surface may be prevented from being so thin as to worsen its picking-up property, and on the other hand, the film for semiconductor back surface may be prevented from being so thick as to produce burr that is derived from the film for semiconductor back surface, around semiconductor chips in dicing.

(Film for Semiconductor Back Surface)

The film for semiconductor back surface 2 has a film shape. The film for semiconductor back surface 2 is usually in an uncured state (including a semi-cured state) in the embodiment of the dicing tape-integrated film for semiconductor back surface as a product and is thermally cured after the dicing tape-integrated film for semiconductor back surface is attached to the semiconductor wafer.

Preferably, the film for semiconductor back surface 2 is formed of at least a thermosetting resin, more preferably formed of at least a thermosetting resin and a thermoplastic resin. A thermal curing-accelerating catalyst may be contained in the resin that constitutes the film for semiconductor back surface 2. When the film for semiconductor back surface 2 is formed of at least a thermosetting resin, the film can effectively exhibit its adhesive function.

Examples of the thermoplastic resin include natural rubber, butyl rubber, isoprene rubber, chloroprene rubber, an ethylene-vinyl acetate copolymer, an ethylene-acrylic acid copolymer, an ethylene-acrylic acid ester copolymer, a polybutadiene resin, a polycarbonate resin, a thermoplastic polyimide resin, a polyamide resin such as 6-nylon and 6,6-nylon, a phenoxy resin, an acrylic resin, a saturated polyester resin such as PET (polyethylene terephthalate) or PBT (polybutylene terephthalate), a polyamideimide resin, or a fluorine resin. The thermoplastic resin may be employed singly or in a combination of two or more kinds. Among these thermoplastic resins, an acrylic resin containing a small amount of ionic impurities, having high heat resistance and capable of securing reliability of a semiconductor element is especially preferable.

The acrylic resins are not particularly restricted, and examples thereof include polymers containing one kind or two or more kinds of esters of acrylic acid or methacrylic acid having a straight chain or branched alkyl group having 30 or less carbon atoms, preferably 4 to 18 carbon atoms, more preferably 6 to 10 carbon atoms, and especially 8 or 9 carbon atoms as component(s). Namely, in the invention, the acrylic resin has a broad meaning also including a methacrylic resin. Examples of the alkyl group include a methyl group, an ethyl group, a propyl group, an isopropyl group, an n-butyl group, a t-butyl group, an isobutyl group, a pentyl group, an isopentyl group, a hexyl group, a heptyl group, a 2-ethylhexyl group, an octyl group, an isooctyl group, a nonyl group, an isononyl group, a decyl group, an isodecyl group, an undecyl group, a dodecyl group (lauryl group), a tridecyl group, a tetradecyl group, a stearyl group, and an octadecyl group.

Moreover, other monomers for forming the acrylic resins (monomers other than the alkyl esters of acrylic acid or methacrylic acid in which the alkyl group is one having 30 or less carbon atoms) are not particularly restricted, and examples thereof include carboxyl group-containing monomers such as acrylic acid, methacrylic acid, carboxyethyl acrylate, carboxylpentyl acrylate, itaconic acid, maleic acid, fumaric acid, and crotonic acid; acid anhydride monomers such as maleic anhydride and itaconic anhydride; hydroxyl group-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxymethylcyclohexyl)-methylacrylate; sulfonic acid group-containing monomers such as styrenesulfonic acid, allylsulfonic acid, 2-(meth)acrylamido-2-methylpropanesulfonic acid, (meth)acrylamidopropanesulfonic acid, sulfopropyl (meth)acrylate, and (meth)acryloyloxynaphthalenesulfonic acid; and phosphoric acid group-containing monomers such as 2-hydroxyethylacryloyl phosphate. In this regard, the (meth)acrylic acid means acrylic acid and/or methacrylic acid, (meth)acrylate means acrylate and/or methacrylate, (meth)acryl means acryl and/or methacryl, etc., which shall be applied over the whole specification.

Moreover, examples of the thermosetting resin include, in addition to an epoxy resin and a phenol resin, an amino resin, an unsaturated polyester resin, a polyurethane resin, a silicone resin and a thermosetting polyimide resin. The thermosetting resin may be employed singly or in a combination of two or more kinds. As the thermosetting resin, an epoxy resin containing only a small amount of ionic impurities which corrode a semiconductor element is suitable. Also, the phenol resin is suitably used as a curing agent of the epoxy resins.

The epoxy resin is not particularly restricted and, for example, a difunctional epoxy resin or a polyfunctional epoxy resin such as a bisphenol A type epoxy resin, a bisphenol F type epoxy resin, a bisphenol S type epoxy resin, a brominated bisphenol A type epoxy resin, a hydrogenated bisphenol A type epoxy resin, a bisphenol AF type epoxy resin, a biphenyl type epoxy resin, a naphthalene type epoxy resin, a fluorene type epoxy resin, a phenol novolak type epoxy resin, an o-cresol novolak type epoxy resin, a trishydroxyphenylmethane type epoxy resin and a tetraphenylolethane type epoxy resin, or an epoxy resin such as a hydantoin type epoxy resin, a trisglycidylisocyanurate type epoxy resin or a glycidylamine type epoxy resin may be used.

As the epoxy resin, among those exemplified above, a novolak type epoxy resin, a biphenyl type epoxy resin, a trishydroxyphenylmethane type epoxy resin, and a tetraphenylolethane type epoxy resin are preferable. This is because these epoxy resins have high reactivity with a phenol resin as a curing agent and are superior in heat resistance and the like.

Furthermore, the above-mentioned phenol resin acts as a curing agent of the epoxy resin, and examples thereof include novolak type phenol resins such as phenol novolak resins, phenol aralkyl resins, cresol novolak resins, tert-butylphenol novolak resins, and nonyiphenol novolak resins; resol type phenol resins; and polyoxystyrenes such as poly-p-oxystyrene. The phenol resin may be employed singly or in a combination of two or more kinds. Among these phenol resins, phenol novolak resins and phenol aralkyl resins are especially preferable. This is because connection reliability of the semiconductor device can be improved.

The mixing ratio of the epoxy resin to the phenol resin is preferably made, for example, such that the hydroxyl group in the phenol resin becomes 0.5 to 2.0 equivalents per equivalent of the epoxy group in the epoxy resin component. It is more preferably 0.8 to 1.2 equivalents. That is, when the mixing ratio becomes outside the range, a curing reaction does not proceed sufficiently, and the characteristics of the epoxy resin cured product tends to deteriorate.

The content of the thermosetting resin is preferably from 5% by weight to 90% by weight of all the resin components in the film for semiconductor back surface 2, more preferably from 10% by weight to 85% by weight, even more preferably from 15% by weight to 80% by weight. When the content is 5% by weight or more, then the thermosetting shrinkage may be readily controlled to be 2% by volume or more. In addition, in thermally curing the encapsulating resin, the film for semiconductor back surface 2 may be fully thermo-cured so as to be surely adhered and fixed to the back surface of a semiconductor element to give a flip chip type semiconductor device with no peeling failure. On the other hand, when the content is 90% by weight or less, then the package (PKG, flip chip type semiconductor device) may be prevented from warping.

Not specifically defined, the thermal curing-accelerating catalyst for epoxy resins and phenolic resins may be suitably selected from known thermal curing-accelerating catalysts. One or more thermal curing-accelerating catalysts may be used here either singly or as combined. As the thermal curing-accelerating catalyst, for example, an amine-based curing-accelerating catalyst, a phosphorus-based curing-accelerating catalyst, an imidazole-based curing-accelerating catalyst, a boron-based curing-accelerating catalyst, or a phosphorus-boron-based curing-accelerating catalyst can be used.

The film for semiconductor back surface is particularly suitably formed of a resin composition containing an epoxy resin and a phenolic resin or a resin composition containing an epoxy resin, a phenolic resin, and an acrylic resin. Since these resins contain only a small amount of ionic impurities and have high heat resistance, reliability of semiconductor elements can be secured.

It is important that the film for semiconductor back surface 2 has adhesiveness (close adhesiveness) to the back surface (non-circuit-formed face) of semiconductor wafer. The film for semiconductor back surface 2 can be, for example, formed of a resin composition containing an epoxy resin as a thermosetting resin component. In case where the film for semiconductor back surface 2 is cured beforehand to some degree, at its preparation, it is preferable to add a polyfunctional compound capable of reacting with the functional group or the like at the molecular chain end of the polymer as a crosslinking agent. Thereby, adhesive characteristics under high temperature can be enhanced and improvement of the heat resistance of the film can be achieved.

The adhesive force of the film for semiconductor back surface to semiconductor wafer (23° C., peeling angle of 180 degrees, peeling rate of 300 mm/min) is preferably within a range of from 0.5 N/20 mm to 15 N/20 mm, more preferably from 0.7 N/20 mm to 10 N/20 mm. When the adhesive force is at least 0.5 N/20 mm, then the film can be adhered to semiconductor wafer and semiconductor element with excellent adhesiveness and is free from film swelling or the like adhesion failure. In addition, in dicing of semiconductor wafer, the chips can be prevented from flying out. On the other hand, when the adhesive force is at most 15 N/20 mm, then it facilitates peeling from the dicing tape.

The crosslinking agent is not particularly restricted and known crosslinking agents can be used. Specifically, for example, not only isocyanate-based crosslinking agents, epoxy-based crosslinking agents, melamine-based crosslinking agents, and peroxide-based crosslinking agents but also urea-based crosslinking agents, metal alkoxide-based crosslinking agents, metal chelate-based crosslinking agents, metal salt-based crosslinking agents, carbodiimide-based crosslinking agents, oxazoline-based crosslinking agents, aziridine-based crosslinking agents, amine-based crosslinking agents, and the like may be mentioned. As the crosslinking agent, an isocyanate-based crosslinking agent or an epoxy-based crosslinking agent is suitable. The crosslinking agent may be employed singly or in a combination of two or more kinds.

Examples of the isocyanate-based crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylylene diisocyanate; and aromatic polyisocyanates such as 2,4-tolylene diisocyanate, 2,6-tolylene diisocyanate, 4,4'-diphenylmethane diisocyanate, and xylylene diisocyanate. In addition, a trimethylolpropane/tolylene diisocyanate trimer adduct [a trade name "COLONATE L" manufactured by Nippon Polyurethane Industry Co., Ltd.], a trimethylolpropane/hexamethylene diisocyanate trimer adduct [a trade name "COLONATE HL" manufactured by Nippon Polyurethane Industry Co., Ltd.], and the like are also used. Moreover, examples of the epoxy-based crosslinking agents include N,N,N',N'-tetraglycidyl-m-xylenediamine, diglycidylaniline, 1,3-bis(N,N-glycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropnane polyglycidyl ether, adipic acid diglycidyl ester, o-phthalic acid diglycidyl ester, triglycidyl-tris(2-hydroxyethyl)isocyanurate, resorcin diglycidyl ether, and bisphenol-S-diglycidyl ether, and also epoxy-based resins having two or more epoxy groups in the molecule.

The amount of the crosslinking agent to be used is not particularly restricted and can be appropriately selected depending on the degree of the crosslinking. Specifically, it is preferable that the amount of the crosslinking agent to be used is usually 7 parts by weight or less (for example, 0.05 to 7 parts by weight) based on 100 parts by weight of the polymer component (particularly, a polymer having a functional group at the molecular chain end). When the amount of the crosslinking agent is larger than 7 parts by weight based on 100 parts by weight of the polymer component, the adhesive force is lowered, so that the case is not preferred. From the viewpoint of improving the cohesive force, the amount of the crosslinking agent is preferably 0.05 parts by weight or more based on 100 parts by weight of the polymer component.

In the invention, instead of the use of the crosslinking agent or together with the use of the crosslinking agent, it is also possible to perform a crosslinking treatment by irradiation with an electron beam, UV light, or the like.

The film for semiconductor back surface is preferably colored. Thereby, an excellent laser marking property and an excellent appearance property can be exhibited, and it becomes possible to make a semiconductor device having a value-added appearance property. As above, since the colored film for semiconductor back surface has an excellent marking property, marking can be performed to impart various kinds of information such as literal information and graphical information to the face on the non-circuit side of the semiconductor element or a semiconductor device using the semiconductor element by utilizing any of various marking methods such as a printing method and a laser marking method through the film of semiconductor back surface. Particularly, by controlling the color of coloring, it becomes possible to observe the information (for example, literal information and graphical information) imparted by marking with excellent visibility. Moreover, when the film for semiconductor back surface is colored, the dicing tape and the film for semiconductor back surface can be easily distinguished from each other, so that workability and the like can be enhanced. Furthermore, for example, as a semiconductor device, it is possible to classify products thereof by using different colors. In the case where the film for semiconductor back surface is colored (the case where the film is neither colorless nor transparent), the color shown by coloring is not particularly limited but, for example, is preferably dark color such as black, blue or red color, and black color is especially suitable.

In the present embodiment, dark color basically means a dark color having $L^*$, defined in $L^*a^*b^*$ color space, of 60 or smaller (0 to 60), preferably 50 or smaller (0 to 50), and more preferably 40 or smaller (0 to 40).

Moreover, black color basically means a black-based color having $L^*$, defined in $L^*a^*b^*$ color space, of 35 or smaller (0 to 35), preferably 30 or smaller (0 to 30), and more preferably 25 or smaller (0 to 25). In this regard, in the black color, each of $a^*$ and $b^*$, defined in the $L^*a^*b^*$ color space, can be suitably selected according to the value of $L^*$. For example, both of $a^*$ and $b^*$ are within the range of preferably −10 to 10, more preferably −5 to 5, and further preferably −3 to 3 (particularly 0 or about 0).

In the present embodiment, $L^*$, $a^*$, and $b^*$ defined in the $L^*a^*b^*$ color space can be determined by a measurement with a color difference meter (a trade name "CR-200" manufactured by Minolta Ltd; color difference meter). The $L^*a^*b^*$ color space is a color space recommended by the Commission Internationale de l'Eclairage (CIE) in 1976, and means a color space called CIE1976($L^*a^*b^*$) color space. Also, the $L^*a^*b^*$ color space is defined in Japanese Industrial Standards in JIS Z8729.

At coloring of the film for semiconductor back surface, according to an objective color, a colorant (coloring agent) can be used. As such a colorant, various dark-colored colorants such as black-colored colorants, blue-colored colorants, and red-colored colorants can be suitably used and black-colored colorants are more suitable. The colorant may be any of pigments and dyes. The colorant may be employed singly or in combination of two or more kinds. In this regard, as the dyes, it is possible to use any forms of dyes such as acid dyes, reactive dyes, direct dyes, disperse dyes, and cationic dyes. Moreover, also with regard to the pigments, the form thereof is not particularly restricted and can be suitably selected and used among known pigments.

In particular, when a dye is used as a colorant, the dye becomes in a state that it is homogeneously or almost homogeneously dispersed by dissolution in the film for semiconductor back surface, so that the film for semiconductor back surface (as a result, the dicing tape-integrated film for semiconductor back surface) having a homogeneous or almost homogeneous color density can be easily produced. Accordingly, when a dye is used as a colorant, the film for semiconductor back surface in the dicing tape-integrated film for semiconductor back surface can have a homogeneous or almost homogeneous color density and can enhance a marking property and an appearance property.

The black-colored colorant is not particularly restricted and can be, for example, suitably selected from inorganic black-colored pigments and black-colored dyes. Moreover, the black-colored colorant may be a colorant mixture in which a cyan-colored colorant (blue-green colorant), a magenta-colored colorant (red-purple colorant), and a yellow-colored colorant (yellow colorant) are mixed. The black-colored colorant may be employed singly or in a combination of two or more kinds. Of course, the black-colored colorant may be used in combination with a colorant of a color other than black.

Specific examples of the black-colored colorant include carbon black (such as furnace black, channel black, acetylene black, thermal black, or lamp black), graphite, copper oxide, manganese dioxide, azo-type pigments (such as azomethine azo black), aniline black, perylene black, titanium black, cyanine black, active charcoal, ferrite (such as non-magnetic ferrite or magnetic ferrite), magnetite, chromium oxide, iron oxide, molybdenum disulfide, a chromium complex, a composite oxide type black pigment, and an anthraquinone type organic black pigment.

In the invention, as the black-colored colorant, black-colored dyes such as C.I. Solvent Black 3, 7, 22, 27, 29, 34, 43, 70, C.I. Direct Black 17, 19, 22, 32, 38, 51, 71, C.I. Acid Black 1, 2, 24, 26, 31, 48, 52, 107, 109, 110, 119, 154, and C.I. Disperse Black 1, 3, 10, 24; black-colored pigments such as C.I. Pigment Black 1, 7; and the like can also be utilized.

As such black-colored colorants, for example, a trade name "Oil Black BY", a trade name "Oil Black BS", a trade name "Oil Black HBB", a trade name "Oil Black 803", a trade name "Oil Black 860", a trade name "Oil Black 5970", a trade name "Oil Black 5906", a trade name "Oil Black 5905" (manufactured by Orient Chemical Industries Co., Ltd.), and the like are commercially available.

Examples of colorants other than the black-colored colorant include cyan-colored colorants, magenta-colored colorants, and yellow-colored colorants. Examples of the cyan-colored colorants include cyan-colored dyes such as C.I. Solvent Blue 25, 36, 60, 70, 93, 95; C.I. Acid Blue 6 and 45; cyan-colored pigments such as C.I. Pigment Blue 1, 2, 3, 15, 15:1, 15:2, 15:3, 15:4, 15:5, 15:6, 16, 17, 17:1, 18, 22, 25, 56, 60, 63, 65, 66; C.I. Vat Blue 4, 60; and C.I. Pigment Green 7.

Moreover, among the magenta colorants, examples of magenta-colored dye include C.I. Solvent Red 1, 3, 8, 23, 24, 25, 27, 30, 49, 52, 58, 63, 81, 82, 83, 84, 100, 109, 111, 121, 122; C.I. Disperse Red 9; C.I. Solvent Violet 8, 13, 14, 21, 27; C.I. Disperse Violet 1; C.I. Basic Red 1, 2, 9, 12, 13, 14, 15, 17, 18, 22, 23, 24, 27, 29, 32, 34, 35, 36, 37, 38, 39, 40; C.I. Basic Violet 1, 3, 7, 10, 14, 15, 21, 25, 26, 27 and 28.

Among the magenta-colored colorants, examples of magenta-colored pigment include C.I. Pigment Red 1, 2, 3, 4, 5, 6, 7, 8, 9, 10, 11, 12, 13, 14, 15, 16, 17, 18, 19, 21, 22, 23, 30, 31, 32, 37, 38, 39, 40, 41, 42, 48:1, 48:2, 48:3, 48:4, 49, 49:1, 50, 51, 52, 52:2, 53:1, 54, 55, 56, 57:1, 58, 60, 60:1, 63, 63:1, 63:2, 64, 64:1, 67, 68, 81, 83, 87, 88, 89, 90, 92, 101, 104, 105, 106, 108, 112, 114, 122, 123, 139, 144, 146, 147, 149, 150, 151, 163, 166, 168, 170, 171, 172, 175, 176, 177, 178, 179, 184, 185, 187, 190, 193, 202, 206, 207, 209, 219, 222, 224, 238, 245; C.I. Pigment Violet 3, 9, 19, 23, 31, 32, 33, 36, 38, 43, 50; C.I. Vat Red 1, 2, 10, 13, 15, 23, 29 and 35.

Moreover, examples of the yellow-colored colorants include yellow-colored dyes such as C.I. Solvent Yellow 19, 44, 77, 79, 81, 82, 93, 98, 103, 104, 112, and 162; yellow-colored pigments such as C.I. Pigment Orange 31, 43; C.I. Pigment Yellow 1, 2, 3, 4, 5, 6, 7, 10, 11, 12, 13, 14, 15, 16, 17, 23, 24, 34, 35, 37, 42, 53, 55, 65, 73, 74, 75, 81, 83, 93, 94, 95, 97, 98, 100, 101, 104, 108, 109, 110, 113, 114, 116, 117, 120, 128, 129, 133, 138, 139, 147, 150, 151, 153, 154, 155, 156, 167, 172, 173, 180, 185, 195; C.I. Vat Yellow 1, 3, and 20.

Various colorants such as cyan-colored colorants, magenta-colored colorants, and yellow-colorant colorants may be employed singly or in a combination of two or more kinds, respectively. In this regard, in the case where two or more kinds of various colorants such as cyan-colored colorants, magenta-colored colorants, and yellow-colorant colorants are used, the mixing ratio (or blending ratio) of these colorants is not particularly restricted and can be suitably selected according to the kind of each colorant, an objective color, and the like.

In the case where the film for semiconductor back surface 2 is colored, the colored form is not particularly restricted. The film for semiconductor back surface may be, for example, a single-layer film-shaped article added with a coloring agent. Moreover, the film may be a laminated film where a resin layer formed of at least a thermosetting resin and a coloring agent layer are at least laminated. In this regard, in the case where the film for semiconductor back surface 2 is a laminated film of the resin layer and the coloring agent layer, the film for semiconductor back surface 2 in the laminated form preferably has a laminated form of a resin layer/a coloring agent layer/a resin layer. In this case, two resin layers at both sides of the coloring agent layer may be resin layers having the same composition or may be resin layers having different composition.

Into the film for semiconductor back surface 2, other additives can be suitably blended according to the necessity. Examples of the other additives include an extender, an anti-aging agent, an antioxidant, and a surfactant, in addition to a filler, a flame retardant, a silane-coupling agent, and an ion-trapping agent.

The filler may be any of an inorganic filler and an organic filler but an inorganic filler is suitable. By blending a filler such as an inorganic filler, imparting of electric conductivity to the film for semiconductor back surface, improvement of the thermal conductivity, control of elastic modulus, and the like can be achieved. In this regard, the film for semiconductor back surface 2 may be electrically conductive or non-conductive. Examples of the inorganic filler include various inorganic powders composed of silica, clay, gypsum, calcium carbonate, barium sulfate, alumina oxide, beryllium oxide, ceramics such as silicone carbide and silicone nitride, metals or alloys such as aluminum, copper, silver, gold, nickel, chromium, lead, tin, zinc, palladium, and solder, carbon, and the like. The filler may be employed singly or in a combination of two or more kinds. Particularly, the filler is suitably silica and more suitably fused silica. The average particle diameter of the inorganic filler is preferably within the range of 0.1 μm to 80 μm. The average particle diameter of the inorganic filler can be measured by a laser diffraction-type particle size distribution measurement apparatus.

The blending amount of the filler (in particular, inorganic filler) is preferably 80 parts by weight or less (0 part by weight to 80 parts by weight) and more preferably 0 part by weight to 70 parts by weight based on 100 parts by weight of the organic resin components.

Examples of the flame retardant include antimony trioxide, antimony pentoxide, and brominated epoxy resins. The flame retardant may be employed singly or in a combination of two or more kinds. Examples of the silane coupling agent include β-(3,4-epoxycyclohexyl)ethyltrimethoxysilane, γ-glycidoxypropyltrimethoxysilane, and γ-glycidoxypropylmethyldiethoxysilane. The silane coupling agent may be employed singly or in a combination of two or more kinds. Examples of the ion-trapping agent include hydrotalcites and bismuth hydroxide. The ion-trapping agent may be employed singly or in a combination of two or more kinds.

The film for semiconductor back surface 2 can be, for example, formed by utilizing a commonly used method including mixing a thermosetting resin such as an epoxy resin and, if necessary, a thermoplastic resin such as an acrylic resin and optional solvent and other additives to prepare a resin composition, followed by forming it to a film-shaped layer. Specifically, a film-shaped layer (adhesive layer) as the film for semiconductor back surface can be formed, for example, by a method including applying the resin composition on the pressure-sensitive adhesive layer 32 of the dicing tape; a method including applying the resin composition on an appropriate separator (such as release paper) to form a resin layer (or an adhesive layer) and then transferring (transcribing) it on the pressure-sensitive adhesive layer 32; or the like. In this regard, the resin composition may be a solution or a dispersion.

Incidentally, in the case where the film for semiconductor back surface 2 is formed of a resin composition containing a thermosetting resin such as an epoxy resin, the film for semiconductor back surface is in a state that the thermosetting resin is uncured or partially cured at a stage before the film is applied to a semiconductor wafer. In this case, after it is applied to the semiconductor wafer (specifically, usually, at the time when the encapsulating material is cured in the flip chip bonding step), the thermosetting resin in the film for semiconductor back surface is completely or almost completely cured.

As above, since the film for semiconductor back surface is in a state that the thermosetting resin is uncured or partially cured even when the film contains the thermosetting resin, the gel fraction of the film for semiconductor back surface is not particularly restricted but is, for example, suitably selected from the range of 50% by weight or less (0 to 50% by weight) and is preferably 30% by weight or less (0 to 30% by weight) and particularly preferably 10% by weight or less (0 to 10% by weight). The gel fraction of the film for semiconductor back surface can be measured by the following measuring method.

<Gel Fraction Measuring Method>

About 0.1 g of a sample is sampled from the film for semiconductor back surface 2 and precisely weighed (weight of sample) and, after the sample is wrapped in a mesh-type sheet, it is immersed in about 50 mL of toluene at room temperature for 1 week. Thereafter, a solvent-insoluble matter (content in the mesh-type sheet) is taken out of the toluene and dried at 130° C. for about 2 hours, the solvent-insoluble matter after drying is weighed (weight after immersion and drying), and a gel fraction (% by weight) is then calculated according to the following expression (a).

Gel fraction (% by weight)=[(Weight after immersion and Drying)/(Weight of sample)]×100    (a)

The gel fraction of the film for semiconductor back surface can be controlled by the kind and content of the resin components and the kind and content of the crosslinking agent and besides, heating temperature, heating time and the like.

In the invention, in the case where the film for semiconductor back surface is a film-shaped article formed of a resin composition containing a thermosetting resin such as an epoxy resin, close adhesiveness to a semiconductor wafer can be effectively exhibited.

Incidentally, since cutting water is used in the dicing step of the semiconductor wafer, the film for semiconductor back surface absorbs moisture to have a moisture content of a normal state or more in some cases. When flip chip bonding is performed with still maintaining such a high moisture content, water vapor remains at the adhesion interface between the film for semiconductor back surface and the semiconductor wafer or its processed body (semiconductor) and lifting is generated in some cases. Therefore, by constituting the film for semiconductor back surface as a configuration in which a core material having a high moisture permeability is provided on each surface thereof, water vapor diffuses and thus it becomes possible to avoid such a problem. From such a viewpoint, a multilayered structure in which the film for semiconductor back surface is formed at one surface or both surfaces of the core material may be used as the film for semiconductor back surface. Examples of the core material include films (e.g., polyimide films, polyester films, polyethylene terephthalate films, polyethylene naphthalate films, polycarbonate films, etc.), resin substrates reinforced with a glass fiber or a plastic nonwoven fiber, silicon substrates, and glass substrates.

The thickness (total thickness in the case of the laminated film) of the film for semiconductor back surface 2 is not particularly restricted but can be, for example, suitably selected from the range of about 2 μm to 200 μm. Furthermore, the thickness is preferably about 4 μm to 160 μm, more preferably about 6 μm to 100 μm, and particularly about 10 μm to 80 μm.

The tensile storage elastic modulus of the film for semiconductor back surface 2 in an uncured state at 23° C. is preferably 1 GPa or more (e.g., 1 GPa to 50 GPa), more preferably 2 GPa or more, and particularly, 3 GPa or more is suitable. When the tensile storage elastic modulus is 1 GPa or more, the attachment of the film for semiconductor back surface to a support can be effectively suppressed or prevented at the time when the film for semiconductor back surface 2 is placed on the support and transportation and the like are performed after the semiconductor chip is peeled from the pressure-sensitive adhesive layer 32 of the dicing tape together with the film for semiconductor back surface 2. In this regard, the support is, for example, a top tape, a bottom tape, and the like in a carrier tape. In the case where the film for semiconductor back surface 2 is formed of a resin composition containing a thermosetting resin, as mentioned above, the thermosetting resin is usually in an uncured or partially cured state, so that the tensile storage elastic modulus of the film for semiconductor back surface at 23° C. is a tensile storage elastic modulus at 23° C. in a state that the thermosetting resin is uncured or partially cured.

Here, the film for semiconductor back surface 2 may be either a single layer or a laminated film where a plurality of layers are laminated. In the case of the laminated film, the tensile storage elastic modulus is sufficiently 1 GPa or more (e.g., 1 GPa to 50 GPa) as the whole laminated film in an uncured state. Also the tensile storage elastic modulus (23° C.) of the film for semiconductor back surface in an uncured state can be controlled by suitably setting up the kind and content of the resin components (thermoplastic resin and/or thermosetting resin) or the kind and content of a filler such as a silica filler. In the case where the film for semiconductor back surface 2 is a laminated film where a plurality of layers are laminated (in the case where the film for semiconductor back surface has a form of the laminated layer), as the laminated layer form, for example, a laminated form composed of a wafer adhesive layer and a laser marking layer can be exemplified. Moreover, between the wafer adhesive layer and the laser marking layer, other layers (an intermediate layer, a light-shielding layer, a reinforcing layer, a colored layer, a base material layer, an electromagnetic wave-shielding layer, a heat conductive layer, a pressure-sensitive adhesive layer, etc.) may be provided. In this regard, the wafer adhesive layer is a layer which exhibits an excellent close adhesiveness (adhesive property) to a wafer and a layer which comes into contact with the back surface of a wafer. On the other hand, the laser marking layer is a layer which exhibits an excellent laser marking property and a layer which is utilized at the laser marking on the back surface of a semiconductor chip.

The tensile storage elastic modulus is determined by preparing the film for semiconductor back surface 2 in an uncured state without lamination onto the dicing tape 3 and measuring elastic modulus in a tensile mode under conditions of a sample width of 10 mm, a sample length of 22.5 mm, a sample thickness of 0.2 mm, a frequency of 1 Hz, and a temperature elevating rate of 10° C./minute under a nitrogen atmosphere at a prescribed temperature (23° C.) using a dynamic viscoelasticity measuring apparatus "Solid Analyzer RS A2" manufactured by Rheometrics Co. Ltd. and the measured elastic modulus is regarded as a value of tensile storage elastic modulus obtained.

Preferably, the film for semiconductor back surface 2 is protected with a separator (release liner) on at least one surface thereof (not shown in figures). For example, in the dicing tape-integrated film for semiconductor back surface 1, a separator may be provided on at least one surface of the film for semiconductor back surface. On the other hand, in the film for semiconductor back surface not integrated with a dicing tape, a separator may be provided on one surface or both surfaces of the film for semiconductor back surface. The separator has a function as a protective material for protecting the film for semiconductor back surface until it is practically used. Further, in the dicing tape-integrated film for semiconductor back surface 1, the separator may further serve as the supporting base material in transferring the film for semiconductor back surface 2 onto the pressure-sensitive adhesive layer 32 of the base material of the dicing tape. The separator is peeled off when a semiconductor wafer is attached onto the film for semiconductor back surface. As the separator, a film of polyethylene or polypropylene, as well as a plastic film (such as polyethylene terephthalate), a paper or the like whose surface is coated with a releasing agent such as a fluorine-based releasing agent or a long-chain alkyl acrylate-based releasing agent can also be used. The separator can be formed by a conventionally known method. Moreover, the thickness or the like of the separator is not particularly restricted.

In case where the film for semiconductor back surface 2 is not laminated with the dicing tape 3, the film for semiconductor back surface 2 may be wound up along with one separator having a release layer on both sides thereof, into a roll in which the film 2 is protected with the separator having a release layer on both surfaces thereof; or the film 2 may be protected with a separator having a release layer on at least one surface thereof.

Moreover, the light transmittance with a visible light (visible light transmittance, wavelength: 400 to 800 nm) in the film for semiconductor back surface 2 is not particularly restricted but is, for example, preferably in the range of 20% or less (0 to 20%), more preferably 10% or less (0 to 10%), and particularly preferably 5% or less (0 to 5%). When the film for semiconductor back surface 2 has a visible light transmittance of more than 20%, there is a concern that the transmission of the light may adversely influence the semiconductor element. The visible light transmittance (%) can be controlled by the kind and content of the resin components of the film for semiconductor back surface 2, the kind and content of the coloring agent (such as pigment or dye), the content of the inorganic filer, and the like.

The visible light transmittance (%) of the film for semiconductor back surface 2 can be determined as follows. Namely, a film for semiconductor back surface 2 having a thickness (average thickness) of 20 μm itself is prepared. Then, the film for semiconductor back surface 2 is irradiated with a visible light having a wavelength of 400 to 800 nm in a prescribed intensity []apparatus: a visible light generating apparatus manufactured by Shimadzu Corporation [trade name "ABSORPTION SPECTRO PHOTOMETER"], and the intensity of transmitted visible light is measured. Further, the visible light transmittance (%) can be determined based on intensity change before and after the transmittance of the visible light through the film for semiconductor back surface 2. In this regard, it is also possible to derive visible light transmittance (%; wavelength: 400 to 800 nm) of the film for semiconductor back surface 2 having a thickness of 20 μm from the value of the visible light transmittance (%; wavelength: 400 to 800 nm) of the film for semiconductor back surface 2 whose thickness is not 20 μm. In the invention, the visible light transmittance (%) is determined in the case of the film for semiconductor back surface 2 having a thickness of 20 μm, but the film for semiconductor back surface according to the invention is not limited to one having a thickness of 20 μm.

Moreover, as the film for semiconductor back surface 2, one having lower moisture absorbance is more preferred. Specifically, the moisture absorbance is preferably 1% by weight or less and more preferably 0.8% by weight or less. By regulating the moisture absorbance to 1% by weight or less, the laser marking property can be enhanced. Moreover, for example, the generation of voids between the film for semiconductor back surface 2 and the semiconductor element can be suppressed or prevented in the reflow step. The moisture absorbance is a value calculated from a weight change before and after the film for semiconductor back surface 2 is allowed to stand under an atmosphere of a temperature of 85° C. and a humidity of 85% RH for 168 hours. In the case where the film for semiconductor back surface 2 is formed of a resin composition containing a thermosetting resin, the moisture absorbance means a value obtained when the film after thermal curing is allowed to stand under an atmosphere of a temperature of 85° C. and a humidity of 85% RH for 168 hours. Moreover, the moisture absorbance can be regulated, for example, by changing the amount of the inorganic filler to be added.

Moreover, as the film for semiconductor back surface 2, one having a smaller ratio of volatile matter is more preferred. Specifically, the ratio of weight decrease (weight decrease ratio) of the film for semiconductor back surface 2 after heating treatment is preferably 1% by weight or less and more preferably 0.8% by weight or less. The conditions for the heating treatment are a heating temperature of 250° C. and a heating time of 1 hour. By regulating the weight decrease ratio to 1% by weight or less, the laser marking property can be enhanced. Moreover, for example, the generation of cracks in a flip chip type semiconductor device can be suppressed or prevented in the reflow step. The weight decrease ratio can be regulated, for example, by adding an inorganic substance capable of reducing the crack generation at lead-free solder reflow. In the case where the film for semiconductor back surface 2 is formed of a resin composition containing a thermosetting resin component, the weight decrease ratio is a value obtained when the film for semiconductor back surface after thermal curing is heated under conditions of a temperature of 250° C. and a heating time of 1 hour.

(Dicing Tape)

The dicing tape 3 includes a base material 31 and a pressure-sensitive adhesive layer 32 formed on the base material 31. Thus, it is sufficient that the dicing tape 3 has a configuration in which the base material 31 and the pressure-sensitive adhesive layer 32 are laminated.

(Base Material)

The base material (supporting base material) can be used as a supporting material for the pressure-sensitive adhesive layer and the like. The base material 31 preferably has a radiation ray-transmitting property. As the base material 31, for example, suitable thin materials, e.g., paper-based base materials such as paper; fiber-based base materials such as fabrics, non-woven fabrics, felts, and nets; metal-based base materials such as metal foils and metal plates; plastic base materials such as plastic films and sheets; rubber-based base materials such as rubber sheets; foamed bodies such as foamed sheets; and laminates thereof [particularly, laminates of plastic based materials with other base materials, laminates of plastic films (or sheets) each other, etc.] can be used. In the invention, as the base material, plastic base materials such as plastic films and sheets can be suitably employed. Examples of raw materials for such plastic materials include olefinic resins such as polyethylene (PE), polypropylene (PP), and ethylene-propylene copolymers; copolymers using ethylene as a monomer component, such as ethylene-vinyl acetate copolymers (EVA), ionomer resins, ethylene-(meth)acrylic acid copolymers, and ethylene-(meth)acrylic acid ester (random, alternating) copolymers; polyesters such as polyethylene terephthalate (PET), polyethylene naphthalate (PEN), and polybutylene terephthalate (PBT); acrylic resins; polyvinyl chloride (PVC); polyurethanes; polycarbonates; polyphenylene sulfide (PPS); amide-based resins such as polyamides (Nylon) and whole aromatic polyamides (aramide); polyether ether ketones (PEEK); polyimides; polyetherimides; polyvinylidene chloride; ABS (acrylonitrile-butadiene-styrene copolymers); cellulose-based resins; silicone resins; and fluorinated resins.

In addition, the materials for the base material 31 include polymers such as crosslinked materials of the foregoing resins. The plastic films may be used without stretching or may be used after subjected to a uniaxial or biaxial stretching treatment, if necessary. According to the resin sheet to which thermal contraction property is imparted by a stretching treatment or the like, the adhered area between the pressure-sensitive adhesive layer 32 and the film for semiconductor back surface 2 is reduced by thermal contraction of the base material 31 after dicing and thus the recovery of the semiconductor chip can be facilitated.

A commonly used surface treatment, e.g., a chemical or physical treatment such as a chromate treatment, ozone exposure, flame exposure, exposure to high-voltage electric shock, or an ionized radiation treatment, or a coating treatment with an undercoating agent e.g., a pressure-sensitive adhesive substance to be mentioned later) may be applied onto the surface of the base material 31 in order to enhance close adhesiveness with the adjacent layer, holding properties, and the like.

As the base material 31, the same kind or different kinds of materials can be suitably selected and used and, if necessary, several kinds of materials can be blended and used. Moreover, to the base material 31, for imparting antistatic ability, a vapor deposition layer of a conductive substance having a thickness of about 30 to 500 angstrom, which is composed of a metal, alloy or an oxide thereof, can be formed on the base material 31. The base material 31 may be a single layer or a multilayer of two or more thereof.

The thickness (total thickness in the case of the laminated layer) of the base material 31 is not particularly restricted and can be appropriately selected depending on strength, flexibility, intended purpose of use, and the like. For example, the thickness is generally 1,000 μm or less (e.g., 1 μm to 1,000 μm), preferably 10 μm to 500 μm, further preferably 20 μm to 300 μm, and particularly preferably about 30 μm to 200 μm but is not limited thereto.

Incidentally, the base material 31 may contain various additives (a coloring agent, a filler, a plasticizer, an antiaging agent, an antioxidant, a surfactant, a flame retardant, etc.) within the range where the advantages and the like of the invention are not impaired.

(Pressure-Sensitive Adhesive Layer)

The pressure-sensitive adhesive layer 32 is formed of a pressure-sensitive adhesive and has a pressure-sensitive adhesiveness. Not specifically defined, the pressure-sensitive adhesive may be suitably selected from known pressure-sensitive adhesives. Concretely, as the pressure-sensitive adhesive, for example, those having the above-mentioned characteristics are suitably selected from known pressure-sensitive adhesives such as acrylic pressure-sensitive adhesives, rubber-based pressure-sensitive adhesives, vinyl alkyl ether-based pressure-sensitive adhesives, silicone-based pressure-sensitive adhesives, polyester-based pressure-sensitive adhesives, polyamide-based pressure-sensitive adhesives, urethane-based pressure-sensitive adhesives, fluorine-based pressure-sensitive adhesives, styrene-diene block copolymer-based pressure-sensitive adhesives, and creep characteristics-improved pressure-sensitive adhesives prepared by incorporating a thermofusible resin having a melting point of not higher than 200° C. to the above-mentioned pressure-sensitive adhesive (for example, see JP-A 56-61468, JP-A-61-174857, JP-A-63-17981, JP-A-56-13040, herein incorporated by reference), and are used herein. As the pressure-sensitive adhesive, also usable here are radiation-curable pressure-sensitive adhesives (or energy ray-curable pressure-sensitive adhesives) and thermally expandable pressure-sensitive adhesives. One or more such pressure-sensitive adhesives may be used here either singly or as combined.

As the pressure-sensitive adhesive, preferred for use herein are acrylic pressure-sensitive adhesives and rubber-based pressure-sensitive adhesives, and more preferred are acrylic pressure-sensitive adhesives. The acrylic pressure-sensitive adhesives include those comprising, as the base polymer, an acrylic polymer (homopolymer or copolymer) of one or more alkyl (meth)acrylates as monomer component(s).

The alkyl (meth)acrylate for the acrylic pressure-sensitive adhesive includes, for example, methyl (meth)acrylate, ethyl (meth)acrylate, propyl (meth)acrylate, isopropyl (meth)acrylate, butyl (meth)acrylate, isobutyl (meth)acrylate, s-butyl (meth)acrylate, t-butyl (meth)acrylate, pentyl (meth)acrylate, hexyl (meth)acrylate, heptyl (meth)acrylate, octyl (meth)acrylate, 2-ethylhexyl (meth)acrylate, isooctyl (meth)acrylate, nonyl (meth)acrylate, isononyl (meth)acrylate, decyl (meth)acrylate, isodecyl (meth)acrylate, undecyl (meth)acrylate, dodecyl (meth)acrylate, tridecyl (meth)acrylate, tetradecyl (meth)acrylate, pentadecyl (meth)acrylate, hexadecyl (meth)acrylate, heptadecyl (meth)acrylate, octadecyl (meth)acrylate, nonadecyl (meth)acrylate, eicosyl (meth)acrylate, etc. As the alkyl (meth)acrylate, preferred are those in which the alkyl group has from 4 to 18 carbon atoms. In the alkyl (meth)acrylate, the alkyl group may be linear or branched.

The acrylic polymer may contain, if desired, a unit corresponding to any other monomer component copolymerizable with the above-mentioned alkyl (meth)acrylate (copolymerizable monomer component), for the purpose of improving the cohesive force, the heat resistance and the crosslinkability thereof. The copolymerizable monomer component includes, for example, carboxyl group-containing monomers such as (meth)acrylic acid (acrylic acid, methacrylic acid), carboxyethyl acrylate, carboxypentyl acrylate, itaconic acid, maleic acid, fumaric acid, crotonic acid; acid anhydride group-containing monomers such as maleic anhydride, itaconic anhydride; hydroxyl group-containing monomers such as hydroxyethyl (meth)acrylate, hydroxypropyl (meth)acrylate, hydroxybutyl (meth)acrylate, hydroxyhexyl (meth)acrylate, hydroxyoctyl (meth)acrylate, hydroxydecyl (meth)acrylate, hydroxylauryl (meth)acrylate, (4-hydroxymethylcyclohexyl) methyl methacrylate; sulfonic acid group-containing monomers such as styrenesulfonic acid, allylsulfonic acid, 2-(meth)acrylamide-2-methylpropanesulfonic acid, (meth)acrylamide-propanesulfonic acid, sulfopropyl (meth)acrylate, (meth)acryloyloxynaphthalenesulfonic acid; phosphoric acid group-containing monomers such as 2-hydroxyethyl acryloylphosphate; (N-substituted) amide monomers such as (meth)acrylamide, N,N-dimethyl(meth)acrylamide, N-butyl (meth)acrylamide, N-methylol(meth)acrylamide, N-methylolpropane(meth)acrylamide; aminoalkyl (meth)acrylate monomers such as aminoethyl (meth)acrylate, N,N-dimethylaminoethyl (meth)acrylate, t-butylaminoethyl (meth)acrylate; alkoxyalkyl (meth)acrylate monomers such as methoxyethyl (meth)acrylate, ethoxyethyl (meth)acrylate; cyanoacrylate monomers such as acrylonitrile, methacrylonitrile; epoxy group-containing acrylic monomers such as glycidyl (meth)acrylate; styrene monomers such as styrene, α-methylstyrene; vinyl ester monomers such as vinyl acetate, vinyl propionate; olefin monomers such as isoprene, butadiene, isobutylene; vinyl ether monomers such as vinyl ether; nitrogen-containing monomers such as N-vinylpyrrolidone, methylvinylpyrrolidone, vinylpyridine, vinylpiperidone, vinylpyrimidine, vinylpiperazine, vinylpyrazine, vinylpyrrole, vinylimidazole, vinyloxazole, vinylmorpholine, N-vinylcarbonamides, N-vinylcaprolactam; maleimide monomers such as N-cyclohexylmaleimide, N-isopropylmaleimide, N-laurylmaleimide, N-phenylmaleimide; itaconimide monomers such as N-methylitaconimide, N-ethylitaconimide, N-butylitaconimide, N-octylitaconimide, N-2-ethylhexylitaconimide, N-cyclohexylitaconimide, N-laurylitaconimide; succinimide monomers such as N-(meth)acryloyloxymethylenesuccinimide, N-(meth)acryloyl-6-oxyhexamethylenesuccinimide, N-(meth)acryloyl-8-oxyoctamethylenesuccinimide; acryl glycolate monomers such as polyethylene glycol (meth)acrylate, polypropylene glycol (meth)acrylate, methoxyethylene glycol (meth)acrylate, methoxypolypropylene glycol (meth)acrylate; acrylate monomers having a hetero ring, a halogen atom, a silicone atom or the like such as tetrahydrofurfuryl (meth)acrylate, fluoro(meth)acrylate, silicone (meth)acrylate; polyfunctional monomers such as hexanediol di(meth)acrylate, (poly)ethylene glycol di(meth)acrylate, (poly)propylene glycol di(meth) acrylate, neopentylglycol di(meth)acrylate, pentaerythritol di(meth)acrylate, trimethylolpropane tri(meth)acrylate, pentaerythritol tri(meth)acrylate, dipentaerythritol hexa(meth) acrylate, epoxyacrylate, polyester acrylate, urethane acrylate, divinylbenzene, butyl di(meth)acrylate, hexyl di(meth)acrylate, etc. One or more these copolymerizable monomer components may be used here either singly or as combined.

The radiation-curable pressure-sensitive adhesive (or energy ray-curable pressure-sensitive adhesive) (composition) usable in the invention includes, for example, an internal-type radiation-curable pressure-sensitive adhesive comprising, as the base polymer, a polymer having a radical-reactive carbon-carbon double bond in the polymer side chain, main chain or main chain terminal, and a radiation-curable pressure-sensitive adhesive prepared by incorporating a UV-curable monomer component or oligomer component in a pressure-sensitive adhesive. The thermally expandable pressure-sensitive adhesive also usable here includes, for example, those comprising a pressure-sensitive adhesive and a foaming agent (especially thermally expandable microspheres).

In the invention, the pressure-sensitive adhesive layer 32 may contain various additives (e.g., a tackifying resin, a coloring agent, a thickener, an extender, a filler, a plasticizer, an antiaging agent, an antioxidant, a surfactant, a crosslinking agent, etc.) within the range where the advantages of the invention are not impaired.

The crosslinking agent is not particularly restricted and known crosslinking agents can be used. Specifically, as the crosslinking agent, not only isocyanate-based crosslinking agents, epoxy-based crosslinking agents, melamine-based crosslinking agents, and peroxide-based crosslinking agents but also urea-based crosslinking agents, metal alkoxide-based crosslinking agents, metal chelate-based crosslinking agents, metal salt-based crosslinking agents, carbodiimide-based crosslinking agents, oxazoline-based crosslinking agents, aziridine-based crosslinking agents, amine-based crosslinking agents, and the like may be mentioned, and isocyanate-based crosslinking agents and epoxy-based crosslinking agents are suitable. The crosslinking agent may be employed singly or in a combination of two or more kinds. Incidentally, the amount of the crosslinking agent to be used is not particularly restricted.

Examples of the isocyanate-based crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylylene diisocyanate; and aromatic polyisocyanates such as 2,4-tolylene diisocyanate, 2,6-tolylene diisocyanate, 4,4'-diphenylmethane diisocyanate, and xylylene diisocyanate. In addition, a trimethylolpropane/ tolylene diisocyanate trimer adduct [a trade name "COLONATE L" manufactured by Nippon Polyurethane Industry Co., Ltd.], a trimethylolpropane/hexamethylene diisocyanate trimer adduct [a trade name "COLONATE HL" manufactured by Nippon Polyurethane Industry Co., Ltd.], and the like are also used. Moreover, examples of the epoxy-based crosslinking agents include N,N,N',N'-tetraglycidyl-m-xylenediamine, diglycidylaniline, 1,3-bis(N,N-glycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropnane polyglycidyl ether, adipic acid diglycidyl ester, o-phthalic acid diglycidyl ester, triglycidyl-tris(2-hydroxyethyl) isocyanurate, resorcin diglycidyl ether, and bisphenol-S-diglycidyl ether, and also epoxy-based resins having two or more epoxy groups in the molecule.

In place of using the crosslinking agent or along with the crosslinking agent in the invention, the pressure-sensitive adhesive layer may be crosslinked through irradiation with electron rays or UV rays.

The pressure-sensitive adhesive layer 32 can be, for example, formed by utilizing a commonly used method including mixing a pressure-sensitive adhesive and optional solvent and other additives and then shaping the mixture into a sheet-like layer. Specifically, for example, there may be mentioned a method including applying a mixture containing a pressure-sensitive adhesive and optional solvent and other additives on the base material 31; a method including applying the foregoing mixture on an appropriate separator (such as a release paper) to form a pressure-sensitive adhesive layer 32 and then transferring (transcribing) it on the base material 31; or the like.

The adhesive force of the pressure-sensitive adhesive layer 32 of the dicing tape 3 to the film for flip chip type semiconductor back surface 2 (23° C., peeling angle of 180 degrees, peeling rate of 300 mm/min) is preferably within a range of from 0.02 N/20 mm to 10 N/20 mm, more preferably from 0.05 N/20 mm to 5 N/20 mm. When the adhesive force is at least 0.02 N/20 mm, then the semiconductor chips may be prevented from flying away in dicing semiconductor wafer. On the other hand, when the adhesive force is at most 10 N/20 mm, then it facilitates peeling of semiconductor chips in picking up them, and prevents the pressure-sensitive adhesive from remaining Incidentally, in the invention, the film for flip-chip type semiconductor back surface 2 or the dicing tape-integrated film for semiconductor back surface 1 can be made to have an antistatic function. Owing to this configuration, the circuit can be prevented from breaking down due to the generation of electrostatic energy at the time adhesion and at the time of peeling thereof or due to charging of a semiconductor wafer or the like by the electrostatic energy. Imparting of the antistatic function can be performed by an appropriate manner such as a method of adding an antistatic agent or a conductive substance to the base material 31, the pressure-sensitive adhesive layer 32, and the film for semiconductor back surface 2, or a method of providing a conductive layer composed of a charge-transfer complex, a metal film, or the like onto the base material 31. As these methods, a method in which an impurity ion having a fear of changing quality of the semiconductor wafer is difficult to generate is preferable. Examples of the conductive substance (conductive filler) to be blended for the purpose of imparting conductivity, improving thermal conductivity, and the like include a sphere-shaped, a needle-shaped, or a flake-shaped metal powder of silver, aluminum, gold, copper, nickel, a conductive alloy, or the like; a metal oxide such as alumina; amorphous carbon black, and graphite. However, the film for semiconductor back surface 2 is preferably non-conductive from the viewpoint of having no electric leakage.

Moreover, the film for flip-chip type semiconductor back surface 2 or the dicing tape-integrated film for semiconductor back surface 1 may be formed in a form where it is wound as a roll or may be formed in a form where the sheet (film) is laminated. For example, in the case where the film has the form where it is wound as a roll, the film is wound as a roll in a state that the film for semiconductor back surface 2 or the laminate of the film for semiconductor back surface 2 and the dicing tape 3 is protected by a separator according to needs, whereby the film can be prepared as a film for semiconductor back surface 2 or a dicing tape-integrated film for semiconductor back surface 1 in a state or form where it is wound as a roll. In this regard, the dicing tape-integrated film for semiconductor back surface 1 in the state or form where it is wound as a roll may be constituted by the base material 31, the pressure-sensitive adhesive layer 32 formed on one surface of the base material 31, the film for semiconductor back surface 2 formed on the pressure-sensitive adhesive layer 32, and a releasably treated layer (rear surface treated layer) formed on the other surface of the base material 31.

Incidentally, the thickness of the dicing tape-integrated film for semiconductor back surface 1 (total thickness of the thickness of the film for semiconductor back surface and the thickness of the dicing tape including the base material 31 and the pressure-sensitive adhesive layer 32) can be, for example, selected from the range of 25 μm to 1,600 μm, and it is preferably from 30 μm to 850 μm, more preferably 35 μm to 500 μm, and particularly preferably 50 μm to 330 μm.

In this regard, in the dicing tape-integrated film for semiconductor back surface 1, by controlling the ratio of the thickness of the film for semiconductor back surface 2 to the thickness of the pressure-sensitive adhesive layer 32 of the dicing tape 3 or the ratio of the thickness of the film for semiconductor back surface 2 to the thickness of the dicing tape (total thickness of the base material 31 and the pressure-sensitive adhesive layer 32), a dicing property at the dicing step, a picking-up property at the picking-up step, and the like can be improved and the dicing tape-integrated film for semiconductor back surface 1 can be effectively utilized from the dicing step of the semiconductor wafer to the flip chip bonding step of the semiconductor chip.

(Producing Method of Dicing Tape-Integrated Film for Semiconductor Back Surface)

The producing method of the dicing tape-integrated film for semiconductor back surface according to the present embodiment is described while using the dicing tape-integrated film for semiconductor back surface 1 shown in FIG. 1 as an example. First, the base material 31 can be formed by a conventionally known film-forming method. Examples of the film-forming method include a calendar film-forming method, a casting method in an organic solvent, an inflation extrusion method in a closely sealed system, a T-die extrusion method, a co-extrusion method, and a dry laminating method.

Next, the pressure-sensitive adhesive composition is applied to the base material 31 and dried thereon (and optionally crosslinked under heat) to form the pressure-sensitive adhesive layer 32. The coating system includes roll coating, screen coating, gravure coating, etc. The pressure-sensitive adhesive layer composition may be directly applied to the base material 31 to form the pressure-sensitive adhesive layer 32 on the base material 31; or the pressure-sensitive adhesive composition may be applied to a release sheet or the like of which the surface has been processed for lubrication, to form the pressure-sensitive adhesive layer 32 thereon, and the pressure-sensitive adhesive layer 32 may be transferred onto the base material 31. With that, the dicing tape 3 is formed having the pressure-sensitive adhesive layer 32 formed on the base material 31.

On the other hand, a forming material for forming the film for semiconductor back surface 2 is applied onto a release sheet to form a coating layer having a predetermined thickness after dried, and then dried under a predetermined condition (optionally heated in case where thermal curing is necessary, and dried) to form the coating layer. The coating layer is transferred onto the pressure-sensitive adhesive layer 32 to thereby form the film for semiconductor back surface 2 on the pressure-sensitive adhesive layer 32. The film for semiconductor back surface 2 may also be formed on the pressure-sensitive adhesive layer 32 by directly applying the forming material for forming the film for semiconductor back surface 2 onto the pressure-sensitive adhesive layer 32 and then drying it under a predetermined condition (optionally heating it in case where thermal curing is necessary, and drying it). According to the process as above, the dicing tape-integrated film for semiconductor back surface 1 of the invention can be obtained. In case where thermal curing is needed in forming the film for semiconductor back surface 2, it is important that the thermal curing is effected to such a degree that the coating layer could be partially cured, but preferably, the coating layer is not thermally cured.

The dicing tape-integrated film for semiconductor back surface 1 of the invention can be suitably used at the production of a semiconductor device including the flip chip connection step. Namely, the dicing tape-integrated film for semiconductor back surface 1 of the invention is used at the production of a flip chip-mounted semiconductor device and thus the flip chip-mounted semiconductor device is produced in a condition or form where the film for semiconductor back surface 2 of the dicing tape-integrated film for semiconductor back surface 1 is attached to the back surface of the semiconductor chip. Therefore, the dicing tape-integrated film for semiconductor back surface 1 of the invention can be used for a flip chip-mounted semiconductor device (a semiconductor device in a state or form where the semiconductor chip is fixed to an adherend such as a substrate by a flip chip bonding method).

The film for semiconductor back surface 2 is usable also for flip chip-mounted semiconductor devices (semiconductor devices in a state or form where a semiconductor chip is fixed to the adherend such as a substrate or the like in a flip chip bonding method), like in the dicing tape-integrated film for semiconductor back surface 1.

(Semiconductor Wafer)

The semiconductor wafer is not particularly restricted as long as it is a known or commonly used semiconductor wafer and can be appropriately selected and used among semiconductor wafers made of various materials. In the invention, as the semiconductor wafer, a silicon wafer can be suitable used.

(Production Process of Semiconductor Device)

The process for producing a semiconductor device according to the invention will be described referring to FIGS. 2A to 2D. FIGS. 2A to 2D are cross-sectional schematic views showing a process for producing a semiconductor device in the case where a dicing tape-integrated film for semiconductor back surface 1 is used.

In the semiconductor device producing process, the dicing tape-integrated film for semiconductor back surface 1 is used to produce a semiconductor device. Concretely, the production process comprises at least a step of attaching a semiconductor wafer onto the film for semiconductor back surface in the dicing tape-integrated film for semiconductor back surface, a step of dicing the semiconductor wafer to form a semiconductor element in which the cutting depth is so controlled as to fall within a range overstepping on one side of the pressure-sensitive adhesive layer that faces the film for semiconductor back surface and not reaching the other side thereof that faces the base material, a peeling step of peeling the semiconductor chip from the pressure-sensitive adhesive layer of the dicing tape together with the film for semiconductor back surface, and a step of flip chip-connecting the semiconductor chip onto an adherend.

(Mounting Step)

Figure 2A:
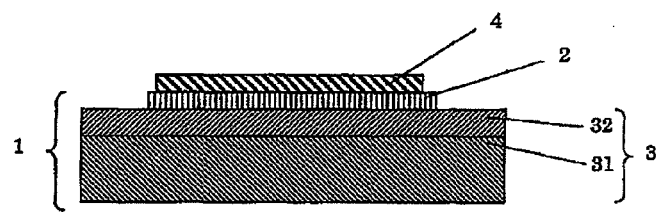
FIGS. 2A to 2D are cross-sectional schematic views showing one embodiment of a process for producing a semiconductor device using a dicing tape-integrated film for semiconductor back surface of the invention.

First, as shown in FIG. 2A, a separator optionally provided on the film for semiconductor back surface 2 of the dicing tape-integrated film for semiconductor back surface 1 is suitably peeled off and the semiconductor wafer 4 is attached onto the film for semiconductor back surface 2 to be fixed by adhesion and holding (mounting step). On this occasion, the film for semiconductor back surface 2 is in an uncured state (including a semi-cured state). Moreover, the dicing tape-integrated film for semiconductor back surface 1 is attached to the back surface of the semiconductor wafer 4. The back surface of the semiconductor wafer 4 means a face opposite to the circuit face (also referred to as non-circuit face, non-electrode-formed face, etc.). The attaching method is not particularly restricted but a method by press bonding is preferred. The press bonding is usually performed while pressing with a pressing means such as a pressing roll.

(Dicing Step)

Figure 2B:
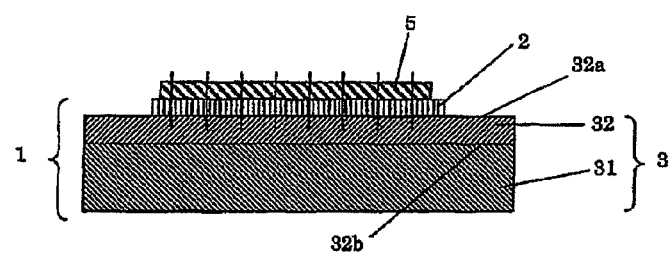

Next, as shown in FIG. 2B, the semiconductor wafer 4 is diced. Thereby, the semiconductor wafer 4 is cut into a prescribed size and individualized (is formed into small pieces) to produce semiconductor chips 5. The dicing is performed according to a normal method from the circuit face side of the semiconductor wafer 4, for example. Moreover, the present step can adopt, for example, a cutting method called full-cut that forms a slit reaching the dicing tape-integrated film for semiconductor back surface 1. The dicing apparatus used in the present step is not particularly restricted, and a conventionally known apparatus can be used. Further, since the semiconductor wafer 4 is adhered and fixed by the dicing tape-integrated film for semiconductor back surface 1 having the film for semiconductor back surface, chip crack and chip fly can be suppressed, as well as the damage of the semiconductor wafer 4 can also be suppressed. In this regard, when the film for semiconductor back surface 2 is formed of a resin composition containing an epoxy resin, generation of adhesive extrusion from the adhesive layer of the film for semiconductor back surface can be suppressed or prevented at the cut surface even when it is cut by dicing. As a result, re-attachment (blocking) of the cut surfaces themselves can be suppressed or prevented and thus the picking-up to be mentioned below can be further conveniently performed.

In the semiconductor device producing process of the invention, the cutting depth in dicing is so controlled as to fall within a range overstepping the side 32a of the pressure-sensitive adhesive layer 32 that faces (contacts) the film for semiconductor back surface 2 and not reaching the side 32b thereof that faces (contacts) the base material 31. Heretofore, in dicing, the semiconductor wafer is cut to the depth to reach the base material to secure the production margin. However, in the invention using the integrated film 1, the production margin can be well secured by cutting to the depth reaching the pressure-sensitive adhesive layer (not reaching base material). Accordingly, the generation of the cutting dust to be caused by cutting the base material 31 can be prevented and, as a result, semiconductor devices of high reliability can be efficiently produced by preventing the generation of burr around semiconductor chips while keeping the good dicing property of the film 1.

The cutting depth is not specifically defined so far as it falls within the range overstepping the upper surface 32a of the pressure-sensitive adhesive layer 32 and not reaching the lower surface 32b thereof. However, in the dicing, it is preferable that the cutting depth is so defined as to fall within a range of from 10% to 70%, more preferably within a range of from 15% to 65%, even more preferably within a range of from 20% to 60%, of the thickness of the pressure-sensitive adhesive layer 32 from the surface 32a of the pressure-sensitive adhesive layer 32 that faces the film for semiconductor back surface 2. When the cutting depth is controlled to fall within the above-mentioned range, then the cutting to reach the base material may be prevented even though the cutting depth accuracy fluctuation of various dicing machines is taken into consideration, and therefore the production process of the invention can readily accept various changes in production lines with preventing deep cutting to reach the base material, and in addition, the production process of the invention in which the cutting depth is controlled as above can well secure the production margin in dicing and can therefore prevent generation of various failures such as dicing failure, etc.

In the case where the dicing tape-integrated film for semiconductor back surface 1 is expanded, the expansion can be performed using a conventionally known expanding apparatus. The expanding apparatus has a doughnut-shaped outer ring capable of pushing the dicing tape-integrated film for semiconductor back surface 1 downward through a dicing ring and an inner ring which has a diameter smaller than the outer ring and supports the dicing tape-integrated film for semiconductor back surface. Owing to the expanding step, it is possible to prevent the damage of adjacent semiconductor chips through contact with each other in the picking-up step to be mentioned below.

(Picking-Up Step)

Figure 2C:
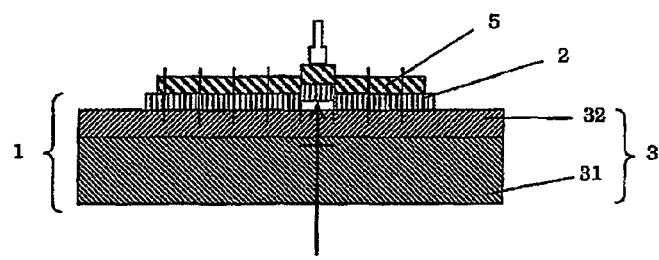

In order to collect the semiconductor chip 5 that is adhered and fixed to the dicing tape-integrated film for semiconductor back surface 1, picking-up of the semiconductor chip 5 is performed as shown in FIG. 2C to peel the semiconductor chip 5 together with the film for semiconductor back surface 2 from the dicing tape 3. The method of picking-up is not particularly restricted, and conventionally known various methods can be adopted. For example, there may be mentioned a method including pushing up each semiconductor chip 5 from the base material 31 side of the dicing tape-integrated film for semiconductor back surface 1 with a needle and picking-up the pushed semiconductor chip 5 with a picking-up apparatus. In this regard, the back surface of the picked-up semiconductor chip 5 is protected with the film for semiconductor back surface 2.

(Flip Chip Connection Step)

Figure 2D:
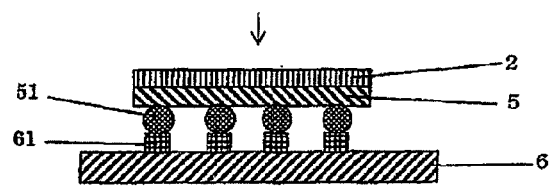

The picked-up semiconductor chip 5 is fixed to an adherend 6 such as a substrate by a flip chip bonding method (flip chip mounting method) as shown in FIG. 2D. Specifically, the semiconductor chip 5 is fixed to the adherend 6 according to a usual manner in a form where the circuit face (also referred to as a front face, circuit pattern-formed face, electrode-formed face, etc.) of the semiconductor chip 5 is opposed to the adherend 6. For example, the bump 51 formed at the circuit face side of the semiconductor chip 5 is brought into contact with a conductive material 61 (such as solder) for conjunction attached to a connecting pad of the adherend 6 and the conductive material 61 is melted under pressing, whereby electric connection between the semiconductor chip 5 and the adherend 6 can be secured and the semiconductor chip 5 can be fixed to the adherend 6 (flip chip bonding step). On this occasion, gaps are formed between the semiconductor chip 5 and the adherend 6 and the distance between the gaps is generally about 30 µm to 300 µm. In this regard, after the flip chip bonding (flip chip connecting) of the semiconductor chip 5 on the adherend 6, it is important that the opposing faces of the semiconductor chip 5 and the adherend 6 and the gaps are washed and an encapsulating material (such as an encapsulating resin) is then filled into the gaps to perform encapsulation.

As the adherend 6, various substrates such as lead frames and circuit boards (such as wiring circuit boards) can be used. The material of the substrates is not particularly restricted and there may be mentioned ceramic substrates and plastic substrates. Examples of the plastic substrates include epoxy substrates, bismaleimide triazine substrates, and polyimide substrates.

In the flip chip bonding step, the material of the bump and the conductive material is not particularly restricted and examples thereof include solders (alloys) such as tin-lead-based metal materials, tin-silver-based metal materials, tin-silver-copper-based metal materials, tin-zinc-based metal materials, and tin-zinc-bismuth-based metal materials, and gold-based metal materials and copper-based metal materials.

Incidentally, in the flip chip bonding step, the conductive material is melted to connect the bump at the circuit face side of the semiconductor chip 5 and the conductive material on the surface of the adherend 6. The temperature at the melting of the conductive material is usually about 260° C. (e.g., 250° C. to 300° C.). The dicing tape-integrated film for semiconductor back surface of the invention can be made to have thermal resistance capable of enduring the high temperature in the flip chip bonding step by forming the film for semiconductor back surface with an epoxy resin or the like.

In the present step, it is preferred to wash the opposing face (electrode-formed face) between the semiconductor chip 5 and the adherend 6 and the gaps. The washing liquid to be used at the washing is not particularly restricted and examples thereof include organic washing liquids and aqueous washing liquids. The film for semiconductor back surface in the dicing tape-integrated film for semiconductor back surface of the invention has solvent resistance against the washing liquid and has substantially no solubility to these washing liquid. Therefore, as mentioned above, various washing liquids can be employed as the washing liquid and the washing can be achieved by any conventional method without requiring any special washing liquid.

Next, an encapsulation step is performed for encapsulating the gaps between the flip chip-bonded semiconductor chip 5 and the adherend 6. The encapsulation step is performed using an encapsulating resin. The encapsulation conditions on this occasion are not particularly restricted but the curing of the encapsulating resin is usually carried out at 175° C. for 60 seconds to 90 seconds. However, in the invention, without limitation thereto, the curing may be performed at a temperature of 165 to 185° C. for several minutes, for example. By the thermal treatment in this step, not only the encapsulating resin but also the film for semiconductor back surface 2 is also thermally cured at the same time. Accordingly, both the encapsulating resin and the film for semiconductor back surface 2 are cured and shrunk with the procedure of the thermal curing. As a result, the stress to be given to the semiconductor chip 5 owing to the curing shrinkage of the encapsulating resin can be cancelled or relaxed through curing shrinkage of the film for semiconductor back surface 2. Moreover, in the step, the film for semiconductor back surface 2 can be completely or almost completely thermally cured and can be attached to the back surface of the semiconductor element with excellent close adhesiveness. Further, the film for semiconductor back surface 2 according to the invention can be thermally cured together with the encapsulating material in the encapsulation step even when the film is in an uncured state, so that it is not necessary to newly add a step for thermal curing of the film for semiconductor back surface 2.

The encapsulating resin is not particularly restricted as long as the material is a resin having an insulating property (an insulating resin) and may be suitably selected and used among known encapsulating materials such as encapsulating resins. The encapsulating resin is preferably an insulating resin having elasticity. Examples of the encapsulating resin include resin compositions containing an epoxy resin. As the epoxy resin, there may be mentioned the epoxy resins exemplified in the above. Furthermore, the encapsulating resin composed of the resin composition containing an epoxy resin may contain a thermosetting resin other than an epoxy resin (such as a phenol resin) or a thermoplastic resin in addition to the epoxy resin. Incidentally, a phenol resin can be utilized also as a curing agent for the epoxy resin and, as such a phenol resin, there may be mentioned phenol resins exemplified in the above.

According to the semiconductor device (flip chip-mounted semiconductor device) manufactured using the dicing tape-integrated film for semiconductor back surface 1 or the film for semiconductor back surface 2, the film for semiconductor back surface is attached to the back surface of the semiconductor chip, and therefore, laser marking can be applied with excellent visibility. In particular, even when the marking method is a laser marking method, laser marking can be applied with an excellent contrast ratio, and it is possible to observe various kinds of information (for example, literal information and graphical information) applied by laser marking with good visibility. At the laser marking, a known laser marking apparatus can be utilized. Moreover, as the laser, it is possible to utilize various lasers such as a gas laser, a solid-state laser, and a liquid laser. Specifically, as the gas laser, any known gas lasers can be utilized without particular limitation but a carbon dioxide laser ($CO_2$ laser) and an excimer laser (ArF laser, KrF laser, XeCl laser, XeF laser, etc.) are suitable. As the solid-state laser, any known solid-state lasers can be utilized without particular limitation but a YAG laser (such as Nd:YAG laser) and a $YVO_4$ laser are suitable.

Since the semiconductor device produced using the dicing tape-integrated film for semiconductor back surface 1 or the film for semiconductor back surface 2 of the invention is a semiconductor device mounted by the flip chip mounting method, the device has a thinned and miniaturized shape as compared with a semiconductor device mounted by a die-bonding mounting method. Thus, the semiconductor devices can be suitably employed as various electronic devices and electronic parts or materials and members thereof. Specifically, as the electronic devices in which the flip chip-mounted semiconductor devices of the invention are utilized, there may be mentioned so-called "mobile phones" and "PHS", small-sized computers [e.g., so-called "PDA" (handheld terminals), so-called "notebook-sized personal computer", so-called "Net Book (trademark)", and so-called "wearable computers", etc.], small-sized electronic devices having a form where a "mobile phone" and a computer are integrated, so-called "Digital Camera (trademark)", so-called "digital video cameras", small-sized television sets, small-sized game machines, small-sized digital audio players, so-called "electronic notepads", so-called "electronic dictionary", electronic device terminals for so-called "electronic books", mobile electronic devices (portable electronic devices) such as small-sized digital type watches, and the like. Needless to say, electronic devices (stationary type ones, etc.) other than mobile ones, e.g., so-called "desktop personal computers", thin type television sets, electronic devices for recording and reproduction (hard disk recorders, DVD players, etc.), projectors, micromachines, and the like may be also mentioned. In addition, electronic parts or materials and members for electronic devices and electronic parts are not particularly restricted and examples thereof include parts for so-called "CPU" and members for various memory devices (so-called "memories", hard disks, etc.).

EXAMPLES

The following will illustratively describe preferred Examples of the invention in detail. However, the invention is not limited to the following Examples unless it exceeds the gist thereof. Moreover, part in each example is a weight standard unless otherwise stated.

Example 1

<Preparation of Film for Semiconductor Back Surface>

113 parts of an epoxy resin (trade name "EPICOAT 1004" manufactured by JER Co., Ltd.), 121 parts of a phenolic resin (trade name "MILEX XLC-4L" manufactured by Mitsui Chemicals, Inc.), 246 parts of sphere silica (trade name "SO-25R" manufactured by Admatechs Co., Ltd.), 5 parts of Dye 1 (trade name "OIL GREEN 502" manufactured by Orient Chemical Industries Co., Ltd.), and 5 parts of Dye 2 (trade name "OIL BLACK BS" manufactured by Orient Chemical Industries Co., Ltd.) based on 100 parts of an acrylate-based polymer (trade name "PARACRON W-197CM" manufactured by Negami Chemical Industrial Co., Ltd.) containing ethyl acrylate and methyl methacrylate as main components were dissolved in methyl ethyl ketone to prepare a solution of a pressure-sensitive adhesive composition having a solid concentration of 23.6% by weight.

The solution of the pressure-sensitive adhesive composition was applied onto a releasably treated film, as a release liner (separator), composed of a polyethylene terephthalate film having a thickness of 50 μm, which had been subjected to a silicone-releasing treatment, and then dried at 130° C. for 2 minutes to prepare a film for semiconductor back surface having a thickness (average thickness) of 20 μm.

<Preparation of Dicing Tape-Integrated Film for Semiconductor Back Surface>

Using a hand roller, the film for semiconductor back surface was attached to the pressure-sensitive adhesive layer of a dicing tape (trade name "V-8-T" manufactured by Nitto Denko Co., Ltd.; average thickness of the base material, 65 μm; average thickness of the pressure-sensitive adhesive layer, 20 μm) to prepare a dicing tape-integrated film for semiconductor back surface.

Example 2

<Preparation of Film for Semiconductor Back Surface>

A film for semiconductor back surface having a thickness (average thickness) of 20 μm was prepared according to the same process as in Example 1.

<Preparation of Dicing Tape-Integrated Film for Semiconductor Back Surface>

Using a hand roller, the film for semiconductor back surface was attached to the pressure-sensitive adhesive layer of a dicing tape (trade name "V-8-T" manufactured by Nitto Denko Co., Ltd.; average thickness of the base material, 65 μm; average thickness of the pressure-sensitive adhesive layer, 30 μm) to prepare a dicing tape-integrated film for semiconductor back surface.

Example 3

<Preparation of Film for Semiconductor Back Surface>

A film for semiconductor back surface having a thickness (average thickness) of 20 μm was prepared according to the same process as in Example 1.

<Preparation of Dicing Tape-Integrated Film for Semiconductor Back Surface>

Using a hand roller, the film for semiconductor back surface was attached to the pressure-sensitive adhesive layer of a dicing tape (trade name "V-8-T" manufactured by Nitto Denko Co., Ltd.; average thickness of the base material, 65 μm; average thickness of the pressure-sensitive adhesive layer, 40 μm) to prepare a dicing tape-integrated film for semiconductor back surface.

Comparative Example 1

<Preparation of Film for Semiconductor Back Surface>

A film for semiconductor back surface having a thickness (average thickness) of 20 μm was prepared according to the same process as in Example 1.

<Preparation of Dicing Tape-Integrated Film for Semiconductor Back Surface>

Using a hand roller, the film for semiconductor back surface was attached to the pressure-sensitive adhesive layer of a dicing tape (trade name "V-8-T" manufactured by Nitto Denko Co., Ltd.; average thickness of the base material, 65 μm; average thickness of the pressure-sensitive adhesive layer, 10 μm) to prepare a dicing tape-integrated film for semiconductor back surface.

Comparative Example 2

<Preparation of Film for Semiconductor Back Surface>

A film for semiconductor back surface having a thickness (average thickness) of 20 μm was prepared according to the same process as in Example 1.

<Preparation of Dicing Tape-Integrated Film for Semiconductor Back Surface>

Using a hand roller, the film for semiconductor back surface was attached to the pressure-sensitive adhesive layer of a dicing tape (trade name "V-8-T" manufactured by Nitto Denko Co., Ltd.; average thickness of the base material, 65 μm; average thickness of the pressure-sensitive adhesive layer, 50 μm) to prepare a dicing tape-integrated film for semiconductor back surface.

(Evaluation)

The dicing tape-integrated films for semiconductor back surface prepared in Examples 1 to 3 and Comparative Examples 1 and 2 were evaluated for the dicing property and the picking-up property thereof according to the method mentioned below. The results are shown in Table 1.

<Evaluating Method of Dicing Property/Picking-Up Property>

Using the dicing tape-integrated film for semiconductor back surface of Examples 1 to 3 and Comparative Examples 1 and 2, a semiconductor wafer was actually diced in the manner mentioned below to thereby evaluate the dicing property of the film. Subsequently, the film was evaluated for the peeling easiness. In that manner, the dicing tape-integrated film for semiconductor back surface was evaluated for the dicing capability and the picking-up capability thereof.

A semiconductor wafer (diameter: 8 inches, thickness: 0.6 mm; a silicon mirror wafer) was subjected to a back surface polishing treatment and a mirror wafer having a thickness of 0.2 mm was used as a workpiece. After the separator was peeled from the dicing tape-integrated film for semiconductor back surface, the mirror wafer (workpiece) was attached onto the film for semiconductor back surface by roller press-bonding at 70° C. With that, the workpiece was diced in such a manner that the cutting depth by the dicing blade could reach the center of the pressure-sensitive adhesive layer of the dicing tape-integrated film. The dicing was performed as full cut so as to be a chip size of 10 mm square. The semiconductor wafer polishing condition, the attaching condition and the dicing condition are as follows.

(Conditions for Semiconductor Wafer Grinding)

Grinding apparatus: a trade name "DFG-8560" manufactured by DISCO Corporation

Semiconductor wafer: 8 inch diameter (back surface was ground so as to be until a thickness of 0.2 mm from a thickness of 0.6 mm)

(Attaching Conditions)

Attaching apparatus: a trade name "MA-3000III" manufactured by Nitto Seiki Co., Ltd.

Attaching speed: 10 mm/min
Attaching pressure: 0.15 MPa
Stage temperature at the time of attaching: 70° C.

(Dicing Conditions)

Dicing apparatus: a trade name "DFD-6361" manufactured by DISCO Corporation

Dicing ring: "2-8-1" (manufactured by DISCO Corporation)

Dicing speed: 30 mm/sec
Dicing blade:
Z1; "2030-SE 27HCDD" manufactured by DISCO Corporation
Z2; "2030-SE 27HCBB" manufactured by DISCO Corporation Dicing blade rotation speed:
Z1; 40,000 r/min
Z2; 45,000 r/min
Blade height:
Z1: 110 μm from the wafer surface
Z2: center of the pressure-sensitive adhesive layer of the dicing tape-integrated film
Cutting method: step cutting
Wafer chip size: 10.0 mm square (Dicing Property Evaluation)

In the dicing operation, the workpiece chips were evaluated for the dicing aptitude as to whether or not they were well diced with no contamination with base material-derived impurities (burr) on the side faces of the workpiece chips and with neither cracking nor breakage of the diced workpiece chips, according to the process mentioned below, (Burr Evaluation)

After picked up, the sides of the chips with the film for semiconductor back surface attached thereto (four sides of all 100 chips) were observed with a microscope (magnification: 20-power). The samples that had been well diced with no burr under the above-mentioned dicing condition were ranked "Good"; and the samples that could not be well diced but had burr around them were ranked "Poor".

(Breakage/Cracking Evaluation)

Like those in burr evaluation, the sides of the chips with the film for semiconductor back surface attached thereto (four sides of all 100 chips) were observed with a microscope (magnification: 20-power). The samples that had not been broken or cracked on the sides thereof were ranked "Good"; and the samples that had been broken or cracked on the sides thereof were ranked "Poor".

(Picking-Up Aptitude Evaluation)

Next, the workpiece chips obtained by dicing were picked up from the pressure-sensitive adhesive layer of the dicing tape together with the film for semiconductor back surface by pushing up the chips from the dicing tape side of the dicing tape-integrated film for semiconductor back surface with a needle, thereby giving the workpiece chips of which the back surface was protected with the film for semiconductor back surface. The picking-up success ratio (%) of the chips (400 pieces in total) on this occasion was determined to evaluate the picking-up property. Therefore, the picking-up property is better when the picking-up ratio is closer to 100%.

The picking-up condition is as follows.

(Semiconductor Wafer Picking-Up Condition)

Picking-up apparatus: trade name "SPA-300" manufactured by Shinkawa Co., Ltd.

Number of picking-up needles: 9 needles
Pushing-up speed of needle: 20 mm/s
Pushing-up distance of needle: 500 μm
Picking-up time: 1 second
Dicing tape-expanding amount: 3 mm

TABLE 1

| | Thickness of Pressure-sensitive adhesive Layer [μm] | Dicing Property | | Picking-Up Property [%] |
|---|---|---|---|---|
| | | burr | breakage, cracking | |
| Example 1 | 20 | Good | Good | 100 |
| Example 2 | 30 | Good | Good | 100 |
| Example 3 | 40 | Good | Good | 100 |
| Comparative Example 1 | 10 | Poor | Good | 100 |
| Comparative Example 2 | 50 | Good | Poor | 70 |

From Table 1, it can be seen that, when the dicing tape-integrated film for semiconductor back surface of Examples 1 to 3 was used, the workpiece chips obtained by dicing were neither cracked nor broken and had no base material-derived burr around the side surfaces thereof, and that the dicing tape-integrated film had good dicing property. In addition, it is further known that, in picking up them, the diced chips exhibited good peeling easiness. On the other hand, the dicing tape-integrated film for semiconductor back surface of Comparative Example 1 produced burr around the sides of the diced workpiece chips though its picking-up property was good, and therefore, the dicing property of the dicing tape-integrated film was poor. When the dicing tape-integrated film for semiconductor back surface of Comparative Example 2 was used in dicing, the diced workpiece chips were cracked or broken, or that is, the dicing property of the dicing tape-integrated film was poor, and in addition, the picking-up property thereof was also poor.

While the present invention has been described in detail and with reference to specific embodiments thereof, it will be apparent to one skilled in the art that various changes and modifications can be made therein without departing from the scope thereof.

This application is based on Japanese patent application No. 2010-170933 filed Jul. 29, 2010, the entire contents thereof being hereby incorporated by reference.

What is claimed is:

1. A dicing tape-integrated film for semiconductor back surface comprising: a dicing tape comprising a base material and a pressure-sensitive adhesive layer laminated in this order, and a film for semiconductor back surface provided on the pressure-sensitive adhesive layer of the dicing tape,
wherein the pressure-sensitive adhesive layer has a thickness of from 20 μm to 40 μm,
wherein the ratio x/y is from 1 to 4, in which x is the thickness of the pressure-sensitive adhesive layer and y is a thickness of the film for semiconductor back surface, and
wherein the ratio z/y is from 1.5 to 25, in which y is a thickness of the film for semiconductor back surface and z is a thickness of the dicing tape.

2. The dicing tape-integrated film for semiconductor back surface according to claim 1, wherein the pressure-sensitive adhesive layer is formed of an acrylic pressure-sensitive adhesive.

3. The dicing tape-integrated film for semiconductor back surface according to claim 1, wherein the pressure-sensitive adhesive layer has an adhesive force to the film for semiconductor back surface of from 0.02 N/20 mm to 10 n/20 mm at 23° C., peeling angle of 180°, and a peeling rate of 300 mm/min.

4. The dicing tape-integrated film for semiconductor back surface according to claim 1, wherein the film for semiconductor back surface has a weight decrease ratio of 1% by weight or less after heating at 250° C. for 1 hour.

5. The dicing tape-integrated film for semiconductor back surface according to claim 1, wherein the film for semiconductor back surface has a moisture absorbance of 1% by weight or less after the film for semiconductor back surface is allowed to sand under an atmosphere of a temperature of 85° C. and a humidity of 85% RH for 168 hours.

* * * * *